United States Patent [19]

Metz et al.

[11] Patent Number: 5,400,202
[45] Date of Patent: Mar. 21, 1995

[54] ELECTROSTATIC DISCHARGE PROTECTION CIRCUIT FOR INTEGRATED CIRCUITS

[75] Inventors: Larry S. Metz; Gordon Motley; George Rieck, all of Fort Collins, Colo.

[73] Assignee: Hewlett-Packard Company, Palo Alto, Calif.

[21] Appl. No.: 898,997

[22] Filed: Jun. 15, 1992

[51] Int. Cl.$^6$ ............................................. H02H 9/04
[52] U.S. Cl. ...................................... 361/56; 361/91; 361/111
[58] Field of Search .................... 361/56, 91, 58, 111; 357/23.13, 38

[56] References Cited

U.S. PATENT DOCUMENTS

| | | | |
|---|---|---|---|
| 3,790,809 | 2/1974 | Kuster | 307/41 |
| 4,400,711 | 8/1983 | Avery | 357/43 |
| 4,698,655 | 10/1987 | Schultz | 357/23.4 |
| 5,173,755 | 12/1992 | Co et al. | 357/23.13 |

OTHER PUBLICATIONS

Avery, "Using SCR's as Transient Protection Structures in Integrated Circuits", EOS/ESD Symp. Proc., EOS-5, pp. 177-180 (1983).
Chatterjee et al., "A Low-Voltage Triggering SCR For On-Chip ESD Protection at Output and Input Pads", Proc. 1990 Symp. VLSI Tech., pp. 75-76.
Duvvury et al., "ESD Phenomena and Protection Issues in CMOS Output Buffers", IEEE/IRPS, pp. 174-180 (1987).
Khurana et al., "ESD On CHMOS Devices-Equivalent Circuits, Physical Models and Failure Mechanisms", IEEE/IRPS, pp. 212-223 (1985).
Rieck et al., "Novel ESD Protection for Advanced CMOS Output Drivers", EOS/ESD Symp. Proc., EOS-11, pp. 182-189 (1989).
Roundtree et al., "A Process-Tolerant Input Protection Circuit For Advanced CMOS Processes", EOS/ESD Symp. Proc., EOS-10, pp. 201-205 (1988).
Wu et al., "A New On-Chip ESD Protection Circuit with Dual Parasitic SCR Structures for CMOS VLSI", IEE Journal of Solid State Circuits, vol. 27, No. 3, Mar. 1992.

*Primary Examiner*—Marc S. Hoff
*Assistant Examiner*—S. Jackson

[57] ABSTRACT

A circuit for protecting integrated circuits from electrostatic discharge by using SCR latchup to divert the ESD current pulse away from sensitive circuit structures. The SCR structure of the invention includes a trigger circuit having an NMOS triggering transistor for activating the SCR when an ESD event occurs on an input/output pad of the integrated circuit being protected. The ESD event on the input/output pad of the integrated circuit is detected by a circuit which applies a trigger voltage to the NMOS triggering transistor to initiate latchup of the SCR independent of junction breakdown of the NMOS triggering transistor. The trigger voltage is generated by an inverter trigger or a capacitor trigger powered by the ESD event so as to trigger SCR latchup so long as the integrated circuit is not powered up ($V_{DD}$ is low). The SCR of the invention may also have a floating well whereby the well resistor $R_w$ of the SCR is replaced by a CMOS device which inhibits forward biasing of the pnp base of the SCR when $V_{DD}$ is high but allows small currents to forward bias the pnp base when $V_{DD}$ is low. The NMOS trigger FET of the invention also may be isolated from the substrate containing the SCR so as to further decrease the effects of junction breakdown conditions on the latchup of the SCR.

11 Claims, 7 Drawing Sheets

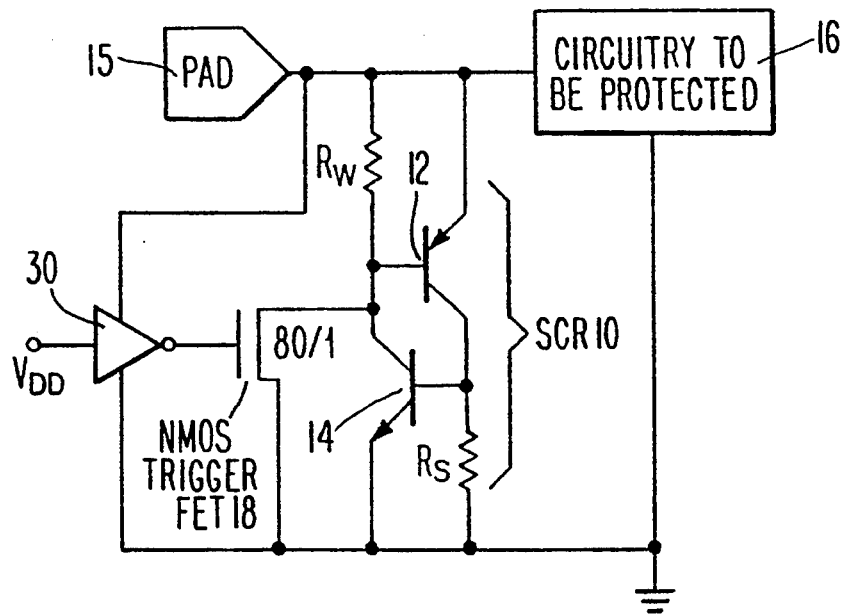
_Fig. 3(a)_
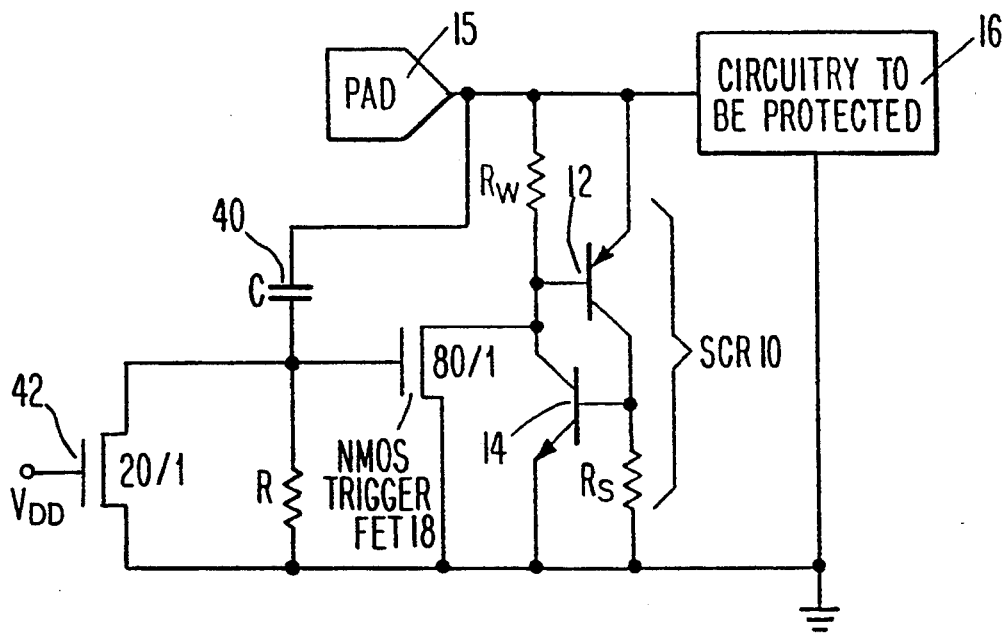
_Fig. 4(a)_

ELECTROSTATIC DISCHARGE PROTECTION CIRCUIT FOR INTEGRATED CIRCUITS

BACKGROUND OF THE INVENTION

1. Field of the Invention

The present invention relates to a circuit for protecting integrated circuits from electrostatic discharge, and more particularly, to an electrostatic discharge protection circuit having a trigger circuit for triggering a silicon controlled rectifier (SCR) circuit which uses the SCR latchup effect present in CMOS processes to divert the electrostatic discharge current pulse away from sensitive integrated circuit structures.

2. Description of the Prior Art

Electrostatic discharge (ESD) causes substantial damage to integrated circuits during and after the chip manufacturing process. ESD events are particularly troublesome for CMOS chips because of their low power requirements and extreme sensitivity. This ESD phenomena has been widely studied. For example, Khurana et al. noted in an article entitled "ESD On CHMOS Devices—Equivalent Circuits, Physical Models and Failure Mechanisms", IEEE/International Reliability Physics Symposium, 1985, pp. 212-223, that on CMOS outputs the n-channel device absorbs most of the ESD and is very fragile, while Duvvury et al. similarly noted in an article entitled "ESD Phenomena and Protection Issues in CMOS Output Buffers", IEEE/International Reliability Physics Symposium, 1987, pp. 174-180, that the avalanche conduction of the n-channel devices absorbs the majority of the ESD. As a result, prior art ESD protection circuits have included one or more n-channel FETs for dissipating current created by an ESD event.

On-chip ESD protection circuits for CMOS chips is essential. Generally, such circuits require a high failure threshold, a small layout size and a low RC delay so as to allow high speed applications. However, such ESD protection circuits have heretofore been difficult to design.

Previously, resistors and diodes were used in CMOS ESD protection circuits, but such resistors and diodes have been gradually replaced by three-layer devices such as field-oxide MOSFETs, gate-oxide MOSFETs and parasitic npn or pnp bipolar junction transistors (BJTs) in CMOS technologies. Others have used a parasitic four-layer pnpn device known as a silicon controlled rectifier (SCR) to protect a chip against the damages caused by ESD events. For example, Avery reported in an article entitled "Using SCR's as Transient Protection Structures in Integrated Circuits" 1983 EOS/ESD Symp Proc., EOS-5, pp. 177-180, that SCRs may be used in ESD protection circuits for bipolar technologies. As described by Avery, an SCR is typically triggered by a positive transient when it exceeds the collector-base breakdown potential of the npn transistors. Relatively recently, the parasitic lateral SCR device has also been used in CMOS on-chip protection circuits. For example, Rieck et al. describe in an article entitled "Novel ESD Protection for Advanced CMOS Output Drivers", 1989 EOS/ESD Symp. Proc., EOS-11, pp. 182-189, that latching devices such as SCRs may be useful for protecting NMOS transistors in CMOS output drivers by increasing the failure voltage of inherently weak drivers. Rountree et al. further describe in an article entitled "A Process-Tolerant Input Protection Circuit For Advanced CMOS Processes" 1988 EOS/ESD Symp Proc., EOS-10, pp. 201-205, that lateral SCRs which are process-tolerant for advanced CMOS processes may be used to protect circuitry from ESD events.

Due to its high current sinking/sourcing capability, very low turn-on impedance, low power dissipation, and large physical volume for heat dissipating, parasitic lateral SCR devices have been recognized in the prior art as one of the most effective elements in CMOS on-chip ESD protection circuits. However, there is a major disadvantage with using the parasitic SCR device in ESD protection circuits in that the SCR device has a high trigger voltage. To perform ESD protection, the trigger voltage of an ESD protection circuit must be less than the voltage which could damage the input buffer or output driver. As described by Rountree et al., the typical trigger voltage of a parasitic lateral SCR device in the ESD protection circuits fabricated by the advanced 1 $\mu$m CMOS process with lightly doped drain and silicided diffusion is about 50 volts if the space from its anode to cathode is 6 $\mu$m. Unfortunately, with such a high trigger voltage the lateral SCR device cannot be used as the only protection element. As a result, a field-planted diode and a diffusion resistor ("secondary protection" elements) have been incorporated with the lateral SCR device in the protection circuit to provide improved ESD protection.

To avoid the use of such "secondary protection" elements, Rieck et al. and others have attempted to reduce the trigger voltage of the parasitic lateral SCR devices. As described by Chatterjee et al., for example, in an article entitled "A Low-Voltage Triggering SCR For On-Chip ESD Protection at Output and Input Pads" Proc. 1990 Symp. VLSI Tech., pp. 75-76, one method is to integrate a low breakdown voltage short-channel NMOS FET within the lateral SCR device to form a "LVTSCR" structure which has a good tunable trigger voltage in the range of 10-15 volts. However, those skilled in the art will appreciate that it may not be generally feasible to combine the NMOS FET and the lateral SCR device in this manner. As described in the aforementioned article to Rieck et al., the other method is to add a "NLCS" mask to make a recessed field implant in the lateral SCR device in order to lower its trigger voltage. Experimental results have shown that the minimum breakdown voltage of such an SCR defined and measured at the initial current flow of 1 $\mu$A is lowered to 9 volts, while its corresponding trigger voltage to initiate the latching state is about 20 volts. However, this approach is generally impractical because of manufacturing control issues.

FIGS. 1(a) and 1(b) illustrate an ESD protection circuit having an SCR structure similar to that described in the aforementioned article to Chatterjee et al. FIG. 1(a) illustrates the circuit diagram, while FIG. 1(b) illustrates the corresponding substrate. The ESD protection device illustrated in FIGS. 1(a) and 1(b) includes an SCR device 10 comprising cross-coupled bipolar PNP transistor 12 and NPN transistor 14 connected between an input/output pad 15 on the integrated circuit 16 to be protected and the chip ground of the integrated circuit 16. The resistance $R_s$ of the p-substrate in which the SCR 10 is formed is illustrated along with the well resistance $R_w$, which establishes a small threshold current which must be reached before the SCR device 10 may be activated. As illustrated in FIGS. 1(a) and 1(b), an NMOS trigger FET 18 is further provided for lowering the triggering voltage of the SCR 10 to the breakdown voltage of the trigger FET 18.

The ESD protection circuit illustrated in FIGS. 1(a) and 1(b) thus requires that a trigger device such as NMOS trigger FET 18 be subjected to junction breakdown conditions before the SCR 10 may be activated. In particular, enough current must flow through the NMOS trigger FET 18 to initiate latchup by SCR device 10. However, since the circuitry 16 being protected can also experience junction breakdown, there is no mechanism in the circuit of FIG. 1 to insure that enough current will flow through the NMOS trigger FET 18 to initiate latchup. Furthermore, there is no assurance that device breakdown effects such as bipolar snapback will result in all the ESD current being absorbed by the output circuitry rather than the illustrated ESD protection structure.

During operation of the circuit of FIG. 1, the NMOS trigger FET 18 operates in the junction breakdown condition to pull current through the well resistor $R_w$. This breakdown voltage is approximately equal to the breakdown voltage of the circuitry to be protected, and, as just noted, it is impossible in such a circuit to insure that the circuitry 16 to be protected will not conduct significant amounts of current due to device breakdown. It is also not possible to ensure that the circuitry 16 to be protected will not "steal" the current from the SCR device 10, thereby inhibiting the SCR device 10 from latching up and absorbing the majority of the ESD event energy.

FIGS. 2(a) and 2(b) illustrate an ESD protection circuit of the type illustrated in FIG. 1 except that an NMOS FET 20 is added for lowering the breakdown voltage by floating the gate of NMOS trigger FET 18 when chip power $V_{DD}$ is low. FIG. 2(a) illustrates the circuit diagram, while FIG. 2(b) illustrates the corresponding substrate. As illustrated, the NMOS FET 20 is responsive to $V_{DD}$ to float the gate of the NMOS trigger FET 18 when the circuitry 16 to be protected is not powered up. Once powered up ($V_{DD}$ goes high), the gate of the trigger FET 18 is grounded so as to minimize the effect of the protection circuitry on the operation of the circuitry 16 to be protected. However, in the circuitry of FIGS. 2(a) and 2(b), latching by the SCR device 10 still relies upon the breakdown of the NMOS trigger FET 18 for initiation of latchup and is still susceptible to current "stealing" by the circuitry 16, which will also have floating gates. Thus, the aforementioned problems have not been overcome by the circuit of FIG. 2.

Accordingly, an ESD protection circuit is still desired which will enable the SCR to latch independent of the breakdown effects of the NMOS trigger FET. The present invention has been designed to meet this need.

SUMMARY OF THE INVENTION

The above-mentioned problems in the prior art have been overcome in accordance with the present invention by providing an ESD protection circuit which uses the well-known SCR latchup effect present in CMOS processes to divert the ESD current pulse away from sensitive circuit structures. In preferred embodiments, this is accomplished using an inverter or a capacitor trigger device which is responsive to an ESD event on the input/output pad of the integrated circuit being protected. This feature of the invention enables the SCR to absorb a high current pulse on the CMOS pad structures caused by an ESD event without any damage to the circuitry being protected.

The ESD protection circuit of the invention ensures that the SCR will latch independent of breakdown effects so as to protect the integrated circuits from an ESD event at input/output pads connected to the integrated circuits. Preferably, such an ESD protection circuit in accordance with the invention comprises a silicon controlled rectifier (SCR) circuit connected between the input/output pad and a device ground of the integrated circuit so as to absorb a current created by an ESD event at the input/output pad. Preferably, means are also provided for actively triggering the SCR circuit to absorb the current created by the ESD event. Preferably, the triggering means comprises a trigger FET for activating the SCR circuit and means responsive to an ESD event at the input/output pad for applying a trigger voltage to a gate of the trigger FET so as to activate the SCR circuit upon receipt of an ESD event at the input/output pad independent of a junction breakdown of the trigger FET.

Several embodiments of the ESD protection circuit are possible in accordance with the invention. For example, in a first embodiment of the invention, the means for applying the trigger voltage to the trigger FET comprises an inverter powered by an ESD event at the input/output pad. The inverter applies the trigger voltage to the gate of the trigger FET when an ESD event occurs at the input/output pad so long as power is not being applied to the integrated circuit.

In a second embodiment of the invention, the means for applying the trigger voltage to the trigger FET comprises a capacitor coupled to the input/output pad for applying a voltage created when an ESD event occurs at the input/output pad to the gate of the trigger FET so long as power is not being applied to the integrated circuit. Preferably, this embodiment of the invention further comprises a FET for grounding the gate of the trigger FET when power is being applied to the integrated circuit.

In either the first or second embodiments, the trigger FET may be formed in a substrate integral with the SCR circuit or disposed physically separate from the substrate containing the SCR circuit so as to minimize breakdown effects. Also, the SCR circuit in either the first or second embodiments may include a well resistance disposed between the input/output pad and the remainder of the SCR circuit in order to establish a voltage drop between the input/output pad and the SCR circuit when current flows through the trigger FET. As a result, the SCR circuit is activated when a portion of the current created by the ESD event at the input/output pad passing through the well resistance creates a voltage drop large enough to turn on the bipolar PNP transistor of the SCR device.

On the other hand, in accordance with presently preferred embodiments of the invention, the well resistance for any of the embodiments may be replaced by means for inhibiting forward bias of the SCR circuit when power ($V_{DD}$) is being applied to the integrated circuit but for allowing forward biasing of the bipolar PNP transistor of the SCR circuit when power is not being applied to the integrated circuit. In a currently preferred embodiment, the bias inhibiting means comprises a PFET and NFET having commonly connected sources connected to the input/output pad and commonly connected drains connected to the SCR circuit, where a gate of the PFET is connected to the gate of the trigger FET and a gate of the NFET is connected to the chip power for the integrated circuit being protected. Preferably, the bias inhibiting means is disposed physically separate from the substrate containing the SCR circuit.

BRIEF DESCRIPTION OF THE DRAWINGS

The objects and advantages of the invention will become more apparent and more readily appreciated from the following detailed description of the presently preferred exemplary embodiments of the invention taken in conjunction with the accompanying drawings, of which:

FIGS. 3(a) and 3(b) illustrate an ESD protection circuit in accordance with the invention comprising an SCR with an inverter trigger responsive to an ESD event on the input/output pad.

FIGS. 4(a) and 4(b) illustrate an ESD protection circuit in accordance with the invention comprising an SCR with a capacitor trigger responsive to an ESD event on the input/output pad.

DETAILED DESCRIPTION OF THE PRESENTLY PREFERRED EXEMPLARY EMBODIMENTS

Figure 1A:
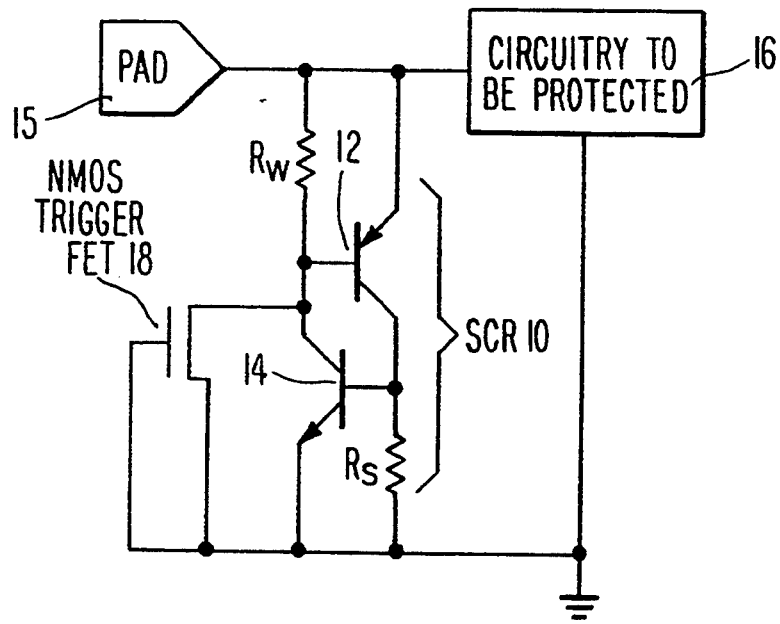
FIGS. 1(a) and 1(b) illustrate a prior art ESD protection circuit comprising an SCR which is triggered by the junction breakdown of an NMOS trigger FET.

An electrical discharge protection circuit for protecting integrated circuits in accordance with the techniques of the invention will now be described with reference to FIGS. 3-7. In each of the figures, part (a) illustrates the circuit diagram while part (b) illustrates the corresponding substrate. In addition, the illustrated FETs are given width/length values in the drawings which correspond to the sizes of these elements in a preferred embodiment. However, it will appreciated by those of ordinary skill in the art that FETs of other sizes may be used and that the description given herein with respect to those figures is for exemplary purposes only and thus not intended in any way to limit the scope of the invention. All questions regarding the scope of the invention may be resolved by referring to the appended claims.

Figure 1B:
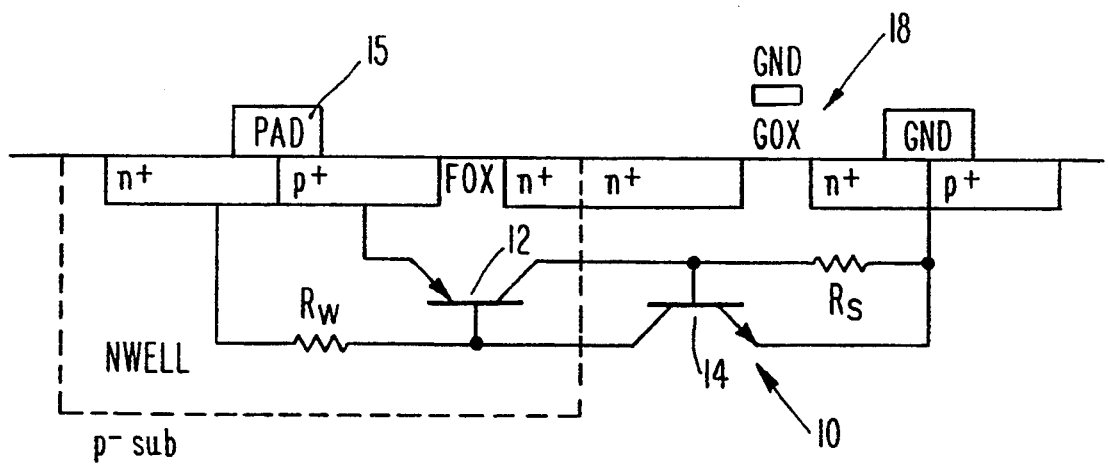
Figure 3B:
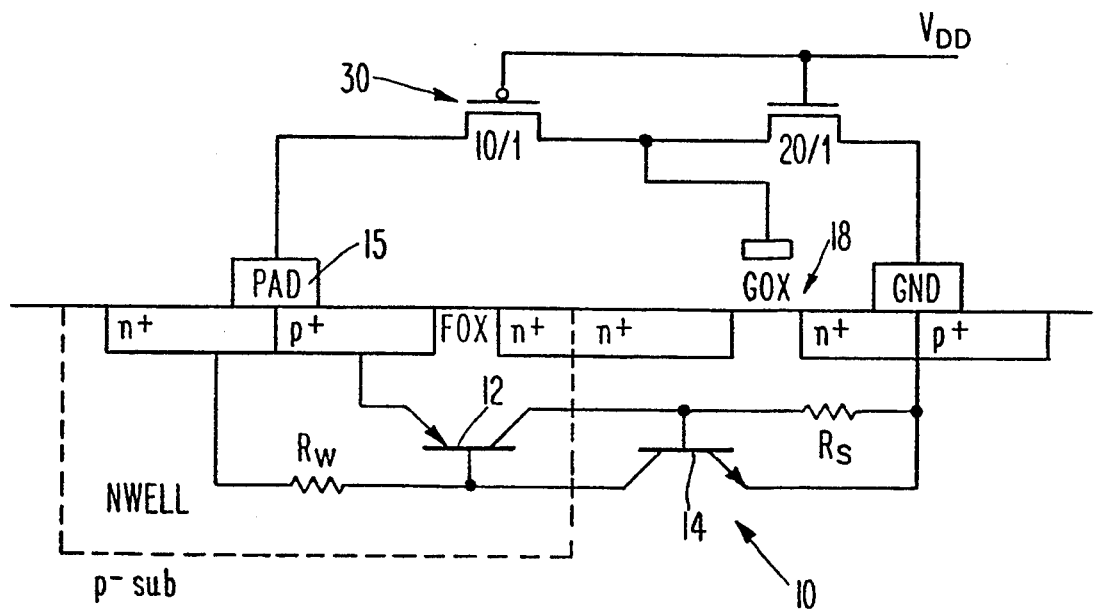

FIGS. 3(a) and 3(b) illustrate an ESD protection circuit comprising an SCR with inverter trigger in accordance with a first embodiment of the invention. The embodiment of FIGS. 3(a) and 3(b) differs from that of prior art FIG. 1 in that a trigger circuit is provided comprising an NMOS trigger FET 18 and an inverter 30 which drives the gate of the NMOS trigger FET 18 in response to an ESD event on the input/output pad 15. As illustrated, inverter 30 receives its power from the input/output pad 15, which is powered by the ESD event. The signal into the inverter 30 ($V_{DD}$) is the chip global positive power supply, while the ground is the chip substrate.

During an ESD event, the chip global power supply $V_{DD}$ is at ground. As the electrostatic discharge into the input/output pad 15 progresses, the voltage on the input/output pad 15 rises so as to power up inverter 30. The inverter 30 in turn drives the input gate of the NMOS trigger FET 18 high, which pulls current through the well resistor $R_w$ in the SCR device 10. When the voltage across the well resistor $R_w$ exceeds approximately 0.7 volt, the upper well transistor 12 turns on, initiating the latching mechanism of the SCR device 10. The latching mechanism is self sustaining once the threshold current is exceeded and will absorb the high current ESD pulse with a relatively low voltage drop. As known to those skilled in the art, the well resistor $R_w$ is not linear and hence inhibits current flow through the SCR device 10 once the threshold current is exceeded.

During chip operation, the global power supply $V_{DD}$ is maintained at voltages equal to or greater than the voltage at the input/output pad 15. This condition results in the output of the inverter 30 always being at ground, which keeps the trigger device from conducting current. Proper design of the relative sizes of the NMOS and PMOS devices forming the inverter 30 (FIG. 3(b)) will keep the gate voltage of the NMOS trigger FET 18 below threshold for a limited range when the voltage of the input/output pad 15 exceeds the power supply voltage $V_{DD}$. The resulting structure ensures that the SCR device 10 will always turn on when an ESD event is received and will latch regardless of breakdown effects since it does not depend on breakdown events to initiate latchup of the SCR device 10. Conversely, the resulting structure ensures that the SCR device 10 will not turn on when the circuitry 16 is powered up ($V_{DD}$ does not equal zero).

Figure 2A:
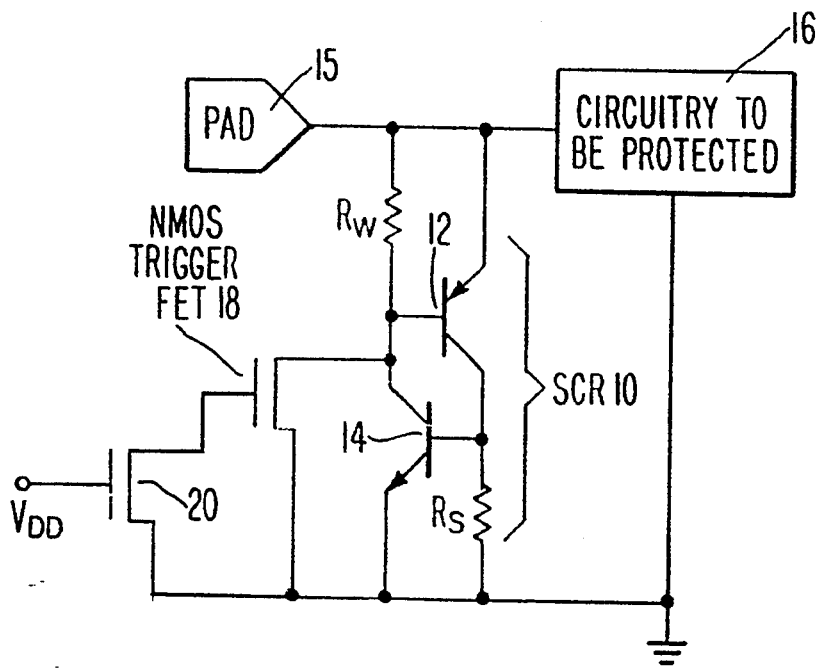
FIGS. 2(a) and 2(b) illustrate a prior art ESD protection circuit comprising an SCR which is triggered by the junction breakdown of an NMOS trigger FET having a floating gate.
Figure 2B:
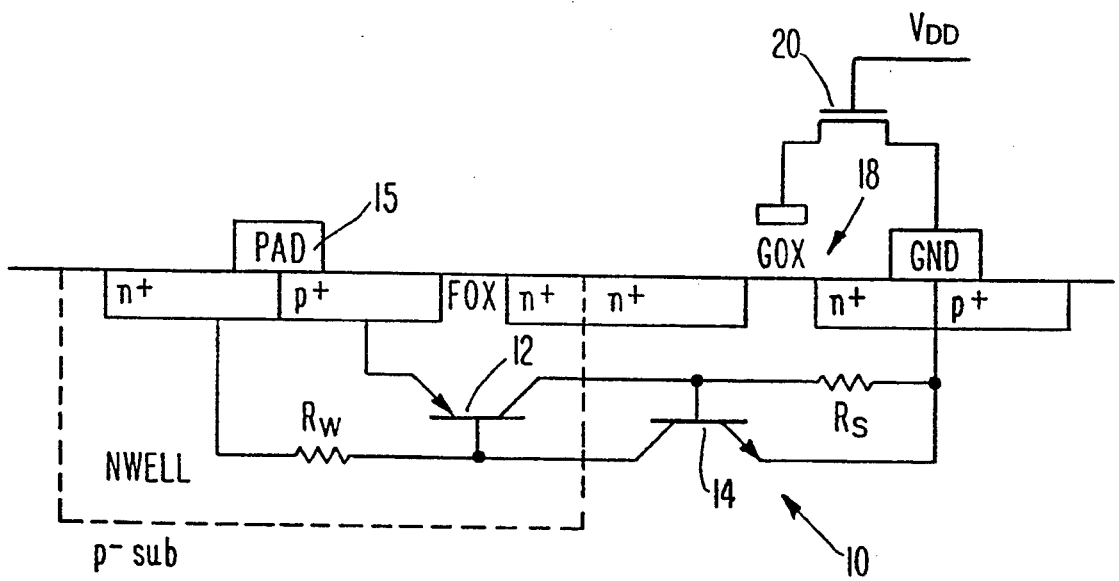
Figure 4B:
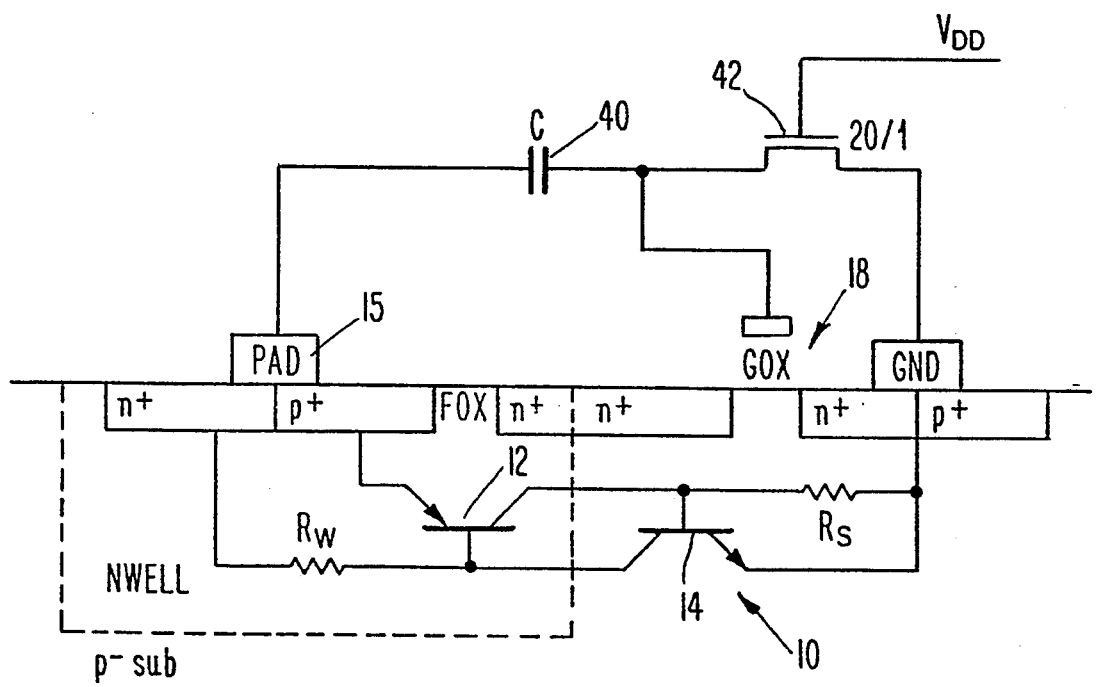

FIGS. 4(a) and 4(b) illustrate an ESD protection circuit comprising an SCR with capacitor trigger in accordance with a second embodiment of the invention. This embodiment primarily differs from that described above with respect to prior art FIG. 2 in that a capacitor 40 has been added to couple an ESD event on the input/output pad 15 to the gate of the NMOS trigger FET 18. A resistor R is also provided to maintain the potential on the gate of the NMOS trigger FET 18, and an NMOS FET 42 is further provided to inhibit the NMOS trigger FET 18 when $V_{DD}$ is high. In the circuit of FIGS. 4(a) and 4(b), a transient voltage on the input/output pad 15 couples onto the gate of the NMOS trigger FET 18, via capacitor 40, thereby turning on the SCR device 10. When $V_{DD}$ is high, NMOS FET 42 grounds the gate of NMOS trigger FET 18 so as to inhibit the trigger.

During an ESD event, when $V_{DD}$ is low, the effectiveness of the coupling is related to the voltage rise time on the input/output pad 15 as determined by the RC time constant of the capacitor 40 and resistor R. The capacitor trigger of this embodiment requires a fast rise time for the input voltage (as for an ESD event) for powering the NMOS trigger FET 18 so that the input/output pad 15 does not power up before $V_{DD}$. However, since when the chip is being powered up the transients are generally much slower than an ESD event, the RC time constant of capacitor 40 and resistor R are ineffective in coupling the transient onto the gate of NMOS trigger FET 18 during power up. In a preferred embodiment, R has a value of 1kΩ and C has a value of 1 pF. As with the embodiment of FIG. 3, the embodiment of FIG. 4 also ensures that the SCR device 10 will latch regardless of breakdown effects since it does not depend on breakdown events to initiate latchup of the SCR device 10.

Figure 5A:
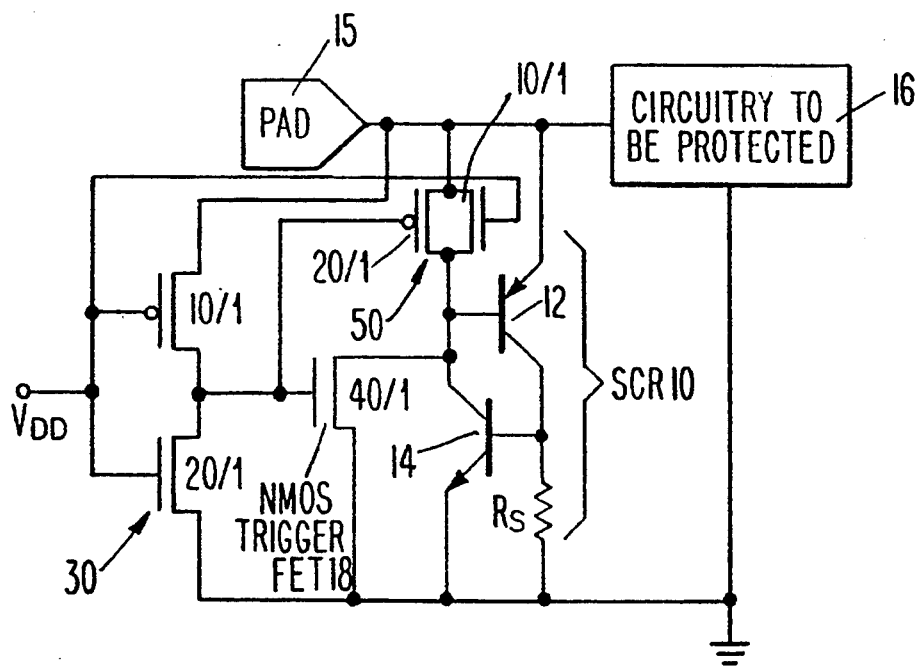
FIGS. 5(a) and 5(b) illustrate an ESD protection circuit in accordance with the invention comprising a floating well SCR with an inverter trigger responsive to an ESD event on the input/output pad.
Figure 5B:
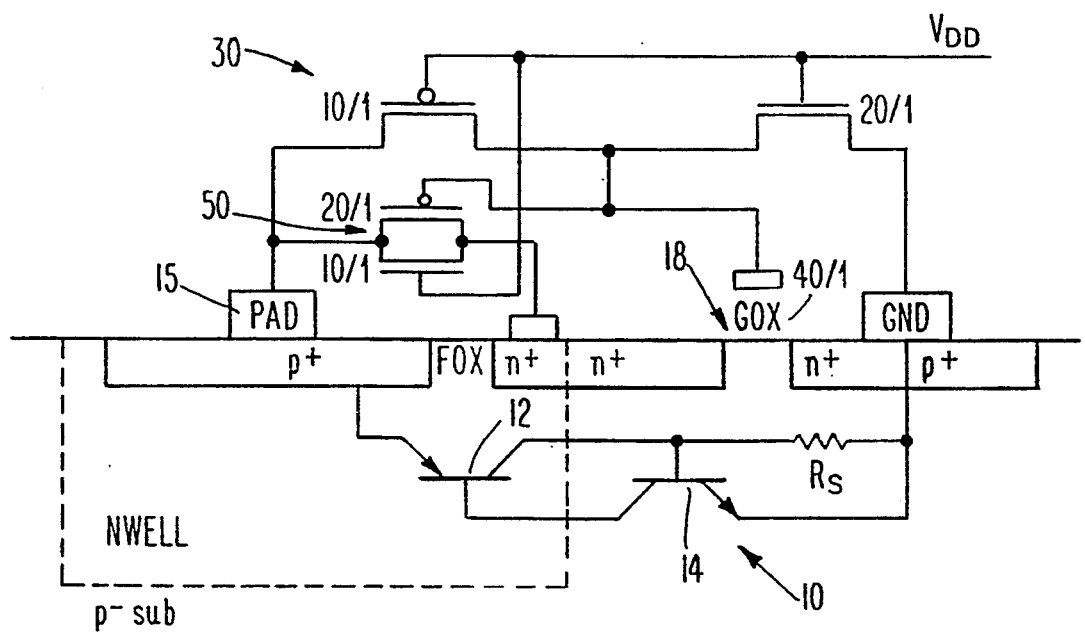

FIGS. 5(a) and 5(b) illustrate an ESD protection circuit comprising a floating well SCR with inverter trigger in accordance with a third embodiment of the invention. This embodiment corresponds to the embodiment of FIG. 3 with the exception that the well resistor $R_w$ is replaced with a CMOS device 50 which inhibits forward biasing of PNP transistor 12 when $V_{DD}$ is high but allows forward biasing of PNP transistor 12 when $V_{DD}$ is low. As illustrated in FIG. 5(b), this CMOS device 50 is preferably external to the substrate of the SCR device 10 structure and comprises a PMOS device and an NMOS device which have commonly connected sources and drains, where the NMOS device is responsive to $V_{DD}$ at its gate, while the PMOS device is responsive to the output of inverter 30 at its gate. As will be apparent to those skilled in the art, the PMOS and NMOS devices can be sized according to the latch conditions desired.

Figure 6A:
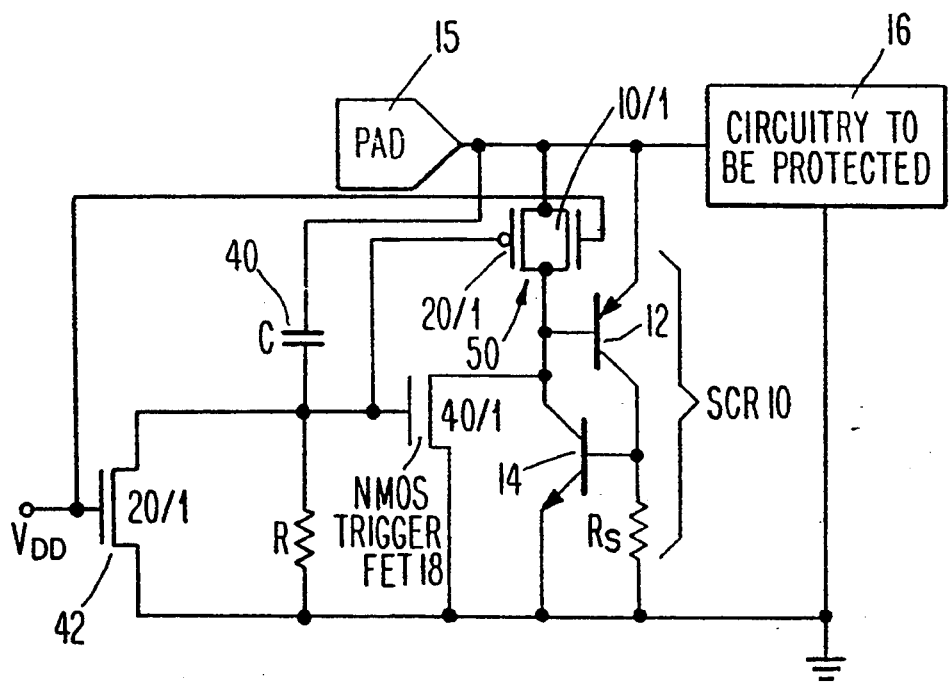
FIGS. 6(a) and 6(b) illustrate an ESD protection circuit in accordance with the invention comprising a floating well SCR with a capacitor trigger responsive to an ESD event on an input/output pad.
Figure 6B:
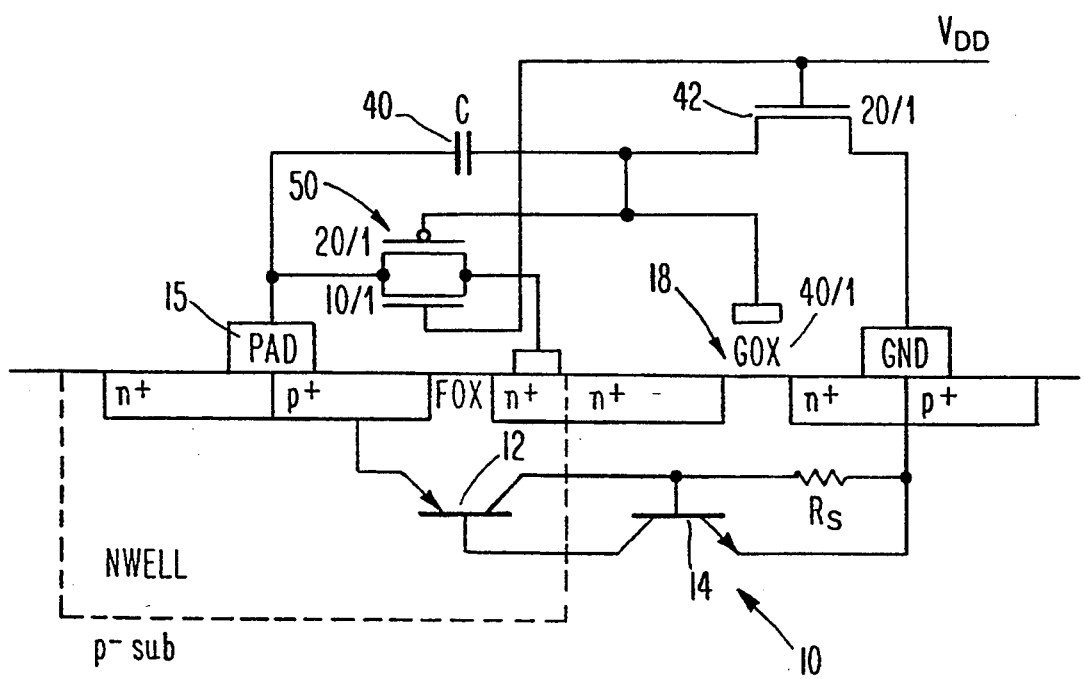

FIGS. 6(a) and 6(b) illustrate an ESD protection circuit comprising a floating well SCR with capacitor trigger in accordance with a fourth embodiment of the invention. This embodiment is similar to the embodiment of FIG. 4 with the exception that the well resistor $R_w$ is replaced with a CMOS device 50 which inhibits forward biasing of PNP transistor 12 when $V_{DD}$ is high but allows forward biasing of PNP transistor 12 when $V_{DD}$ is low. As in the embodiment of FIG. 5, the floating well SCR of FIG. 6 is more efficient for a given unit area in that during an ESD event all current is pulled through the base of the SCR transistors in the substrate well to cause a lower latchup current requirement, thereby improving the SCR trigger characteristics. However, in the absence of the well resistor $R_w$, CMOS device 50 must inhibit the SCR device 10 when it is not desired for the SCR device 10 to turn on, as when the integrated circuit is powered up. For this purpose, CMOS device 50 is added in place of the well resistor $R_w$ to inhibit firing when the system is powered up by inhibiting latching as a function of the voltage of the input/output pad 15. As with the embodiments of FIGS. 3 and 4, the structures of FIGS. 5 and 6 also ensure that the SCR device 10 will latch regardless of breakdown effects since it does not depend on breakdown events to initiate latchup.

Thus, in the embodiments of FIGS. 5 and 6, the CMOS device 50 inhibits triggering when $V_{DD}$ is high, while the well floats when $V_{DD}$ is low and the input voltage on input/output pad 15 is high. This makes the resulting CMOS device 50 easy to forward bias while still keeping the SCR device 10 from triggering in the absence of an ESD event. Typically, the p+ region under the pad is forward biased to the n well to turn on the SCR device 10 for a threshold voltage of 0.7 volt at a corresponding current of 30 mA. The resulting ESD protection device triggers well below the junction breakdown voltage of the integrated circuit 16 to be protected but does not trigger during normal operation.

Figure 7:
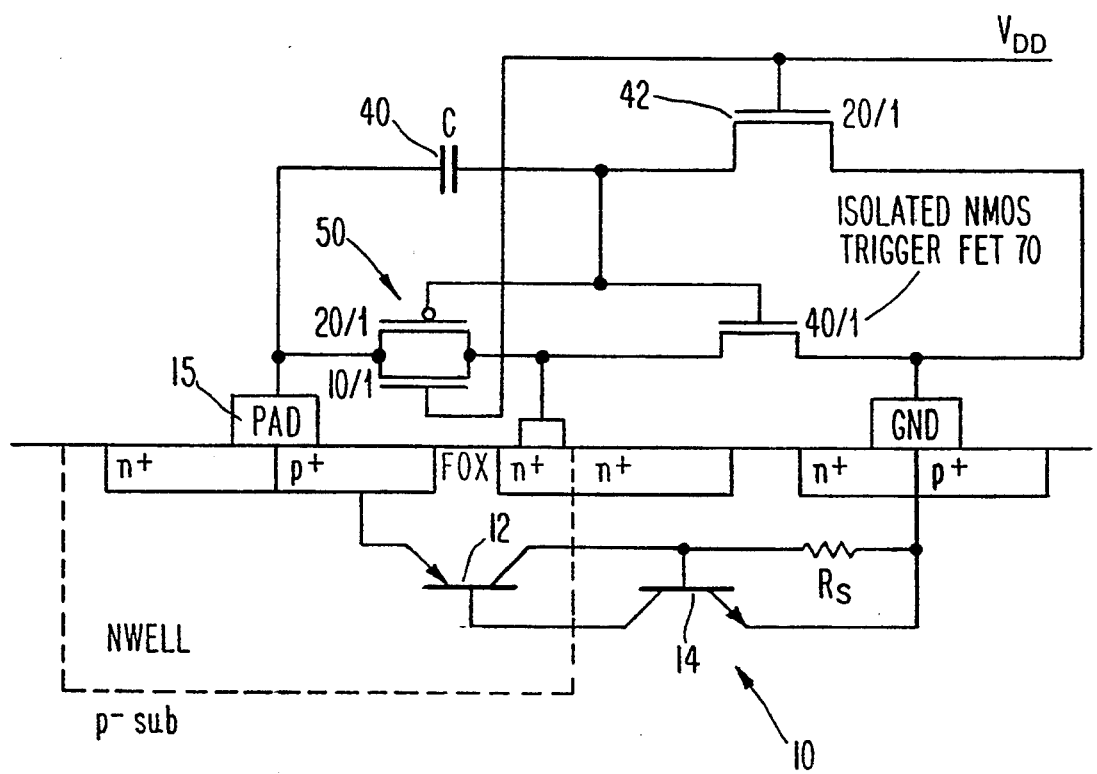
FIG. 7 illustrates an ESD protection circuit in accordance with the invention comprising a floating well SCR with a capacitor trigger having an isolated NMOS trigger FET responsive to an ESD event on an input/output pad.

FIG. 7 illustrates an ESD protection circuit comprising a floating well SCR with capacitor trigger as in the embodiment of FIG. 6 except that NMOS trigger FET 18 in the substrate with SCR device 10 has been removed from the substrate and replaced by an isolated (physically separate) NMOS trigger FET 70. By so removing the NMOS trigger FET 18 from the substrate of the SCR device 10 and keeping it physically separate from the SCR device 10, latchup of the SCR device 10 is even less dependent upon breakdown effects of the NMOS trigger FET 70. Of course, the other embodiments may be modified to have an isolated NMOS trigger FET as well.

For proper operation of the present invention, those skilled in the art will appreciate that $V_{DD}$ must not be connected to the pad through a diode or a PMOS FET so that during an ESD event $V_{DD}$ will remain at ground potential. Also, since the current through the ESD protection circuits in the different embodiments of the invention typically saturate at approximately 800–900 mA for element sizes indicated, those skilled in the art will also appreciate that modifications will need to be made to the different embodiments if greater currents need to be handled. For example, by simply doubling the structure size a 1600–1800 mA "saturation" current may be obtained for a single trigger circuit. Also, for reasons such as those taught by Wu et al. in an article entitled "A New On-Chip ESD Protection Circuit with Dual Parasitic SCR Structures for CMOS VLSI" IEEE Journal of Solid State Circuits, Vol. 27, No. 3, Mar. 1992, it may also be desirable to use dual SCR structures to protect for positive and negative ESD events. For example, an ESD event from one pad to another pad may be handled by using one forward biased SCR device 10 and one reverse biased SCR device 10.

Thus, in accordance with the invention, an ESD event turns the NMOS trigger FET 18 on rather than break it down as in prior art devices. This prevents the aforementioned problems whereby the circuitry 16 being protected also experiences junction breakdown before the SCR device 10 latches up. This is made possible by actively driving the gate of the NMOS trigger FET 18 in response to an ESD event as herein described.

Although a few exemplary embodiments of the invention have been described in detail above, those skilled in the art will appreciate that many additional modifications are possible in the exemplary embodiments without materially departing from the novel teachings and advantages of the invention. Accordingly, all such modifications are intended to be included within the scope of this invention as defined in the following claims.

We claim:

1. An electrostatic discharge (ESD) protection circuit for protecting an integrated circuit from an ESD event at an input/output pad connected to said integrated circuit, comprising:

a silicon controlled rectifier (SCR) circuit connected between said input/output pad and a device ground of said integrated circuit for absorbing current created by said ESD event at said input/output pad; and means for actively triggering said SCR circuit to absorb said current created by said ESD event, said triggering means comprising a trigger FET for activating said SCR circuit and an inverter powered by said ESD event at said input/output pad for applying a trigger voltage to a gate of said trigger FET when said ESD event occurs at said input/output pad at a time when power is not being applied to said integrated circuit.

2. A circuit as in claim 1, wherein said trigger FET is formed in a substrate integral with said SCR circuit.

3. A circuit as in claim 1, wherein said trigger FET is disposed physically separate from a substrate containing said SCR circuit.

4. A circuit as in claim 1, wherein said SCR circuit comprises a well resistance disposed between said input/output pad and said SCR circuit in order to establish a voltage drop between said input/output pad and said SCR circuit when current flows through said trigger FET, whereby said SCR circuit is activated when a portion of said current created by said ESD event at said input/output pad passing through said well resistance creates a voltage drop large enough to turn on said SCR circuit.

5. A circuit as in claim 1, further comprising means for inhibiting forward bias of said SCR circuit when power is being applied to said integrated circuit but for allowing forward biasing of said SCR circuit when power is not being applied to said integrated circuit.

6. A circuit as in claim 5, wherein said bias inhibiting means comprises a PFET and NFET having commonly connected sources connected to said input/output pad and commonly connected drains connected to said SCR circuit, a gate of said PFET being connected to said gate of said trigger FET and a gate of said NFET being connected to a power source for said integrated circuit.

7. A circuit as in claim 5, wherein said bias inhibiting means is disposed physically separate from a substrate containing said SCR circuit.

8. An electrostatic discharge (ESD) protection circuit for protecting an integrated circuit from an ESD event at an input/output pad connected to said integrated circuit, comprising:
   a silicon controlled rectified (SCR) circuit connected between said input/output pad and a device ground of said integrated circuit for absorbing current created by said ESD event at said input/output pad;
   means for actively triggering said SCR circuit to absorb said current created by said ESD event, said triggering means comprising a trigger FET for activating said SCR circuit and means responsive to said ESD event at said input/output pad for applying a trigger voltage to a gate of said trigger FET so as to activate said SCR circuit upon receipt of said ESD event at said input/output pad independent of a junction breakdown of said trigger FET; and
   means connected between said input/output pad and said SCR circuit for inhibiting forward bias of said SCR circuit when power is being applied to said integrated circuit but for allowing forward biasing of said SCR circuit when power is not being applied to said integrated circuit.

9. A circuit as in claim 8, wherein said bias inhibiting means comprises a PFET and NFET having commonly connected sources connected to said input/output pad and commonly connected drains connected to said SCR circuit, a gate of said PFET being connected to said gate of said trigger FET and a gate of said NFET being connected to a power source for said integrated circuit.

10. A circuit as in claim 8, wherein said bias inhibiting means and said trigger FET are disposed physically separate from a substrate containing said SCR circuit.

11. A circuit as in claim 8, wherein said trigger FET is formed in a substrate integral with said SCR circuit.

* * * * *